(12) United States Patent
Boon et al.

(10) Patent No.: US 12,266,744 B2
(45) Date of Patent: Apr. 1, 2025

(54) METHOD FOR PRODUCING OPTOELECTRONIC SEMICONDUCTOR DEVICES AND OPTOELECTRONIC SEMICONDUCTOR DEVICE

(71) Applicant: OSRAM Opto Semiconductors GmbH, Regensburg (DE)

(72) Inventors: Mei See Boon, Sungai Siput (MY); Hui Chiang Teoh, Jitra (MY); Tomin Liu, Kuching (MY); Hui Ying Pee, Penang (MY); Asliza Alias, Penang (MY); Lay Teng Tan, Penang (MY); Yuan Liang, Penang (MY); Alex Kheng Hooi Lim, Penang (MY); Wing Yew Wong, Penang (MY)

(73) Assignee: OSRAM Opto Semiconductors GmbH, Regensburg (DE)

( * ) Notice: Subject to any disclaimer, the term of this patent is extended or adjusted under 35 U.S.C. 154(b) by 425 days.

(21) Appl. No.: 17/284,825

(22) PCT Filed: Oct. 22, 2018

(86) PCT No.: PCT/EP2018/078866
§ 371 (c)(1),
(2) Date: Apr. 13, 2021

(87) PCT Pub. No.: WO2020/083460
PCT Pub. Date: Apr. 30, 2020

(65) Prior Publication Data
US 2021/0359174 A1 Nov. 18, 2021

(51) Int. Cl.
*H01L 33/54* (2010.01)
*H01L 33/50* (2010.01)
*H01L 33/62* (2010.01)

(52) U.S. Cl.
CPC ............ *H01L 33/54* (2013.01); *H01L 33/505* (2013.01); *H01L 33/62* (2013.01); *H01L 2933/005* (2013.01)

(58) Field of Classification Search
CPC ....... H01L 33/54; H01L 33/505; H01L 33/62; H01L 2933/005; H01L 33/52
See application file for complete search history.

(56) References Cited

U.S. PATENT DOCUMENTS

| 5,444,025 A | 8/1995 | Sono et al. |
| 7,791,014 B2 | 9/2010 | Camargo et al. |

(Continued)

FOREIGN PATENT DOCUMENTS

| CN | 101138094 A | 3/2008 |
| CN | 106298650 A | 1/2017 |

(Continued)

OTHER PUBLICATIONS

3M™ Novec™ 1700 Electronic Grade Coationg, 3M, Product Information, May 15, 2019, 2 pages.

(Continued)

*Primary Examiner* — Kimberly N Rizkallah
*Assistant Examiner* — Zhijun Xu
(74) *Attorney, Agent, or Firm* — Slater Matsil, LLP

(57) ABSTRACT

In an embodiment a method includes providing a light-emitting diode chip and a phosphor body, applying a sacrificial layer to a top side of the phosphor body only, placing the phosphor body onto the light-emitting diode chip, molding an encapsulation body directly around the light-emitting diode chip and the phosphor body by a film assisted molding, wherein at least in places a top face of the sacrificial layer facing away from the phosphor body remains unsealed (Continued)

with a molding film, and removing the sacrificial layer so that the top side of the phosphor body is free of the sacrificial layer.

10 Claims, 5 Drawing Sheets

(56) References Cited

U.S. PATENT DOCUMENTS

| | | |
|---|---|---|
| 9,276,183 B2 | 3/2016 | Gruendl et al. |
| 9,536,756 B1 | 1/2017 | Talledo et al. |
| 9,786,824 B2 | 10/2017 | Illek et al. |
| 9,818,921 B2 | 11/2017 | Ramchen et al. |
| 10,217,731 B2 | 2/2019 | Singer et al. |
| 10,910,351 B2 | 2/2021 | Nagel |
| 10,937,932 B2 | 3/2021 | Nagel et al. |
| 2002/0035222 A1 | 3/2002 | Oh et al. |
| 2004/0206452 A1* | 10/2004 | Okuda ................... B08B 3/02 156/345.11 |
| 2008/0179503 A1* | 7/2008 | Camargo ............... H01L 33/54 257/E33.059 |
| 2009/0004373 A1 | 1/2009 | Rath et al. |
| 2012/0052608 A1* | 3/2012 | Yoo ........................ B32B 9/045 428/688 |
| 2013/0193470 A1 | 8/2013 | Weidner et al. |
| 2014/0001948 A1* | 1/2014 | Katayama ............... H01L 33/50 313/498 |
| 2016/0005936 A1* | 1/2016 | Illek ....................... H01L 33/54 438/26 |
| 2016/0013380 A1 | 1/2016 | Moosburger et al. |
| 2016/0254424 A1 | 9/2016 | Zitzlsperger et al. |
| 2018/0182934 A1* | 6/2018 | Lin-Lefebvre ......... H01L 33/62 |
| 2019/0157249 A1 | 5/2019 | Nagel |

FOREIGN PATENT DOCUMENTS

| | | |
|---|---|---|
| DE | 102017127597 A1 | 5/2019 |
| DE | 102018104381 A1 | 8/2019 |
| EP | 0400808 A2 | 12/1990 |
| EP | 1858086 A1 | 11/2007 |
| WO | 2011160968 A1 | 12/2011 |
| WO | 2013139735 A1 | 9/2013 |
| WO | 2014127933 A1 | 8/2014 |
| WO | 2016087360 A1 | 6/2016 |
| WO | 2016146297 A1 | 9/2016 |
| WO | 2016148019 A1 | 9/2016 |

OTHER PUBLICATIONS

Aquabond® Technologies, "Thermoplastic Adhesives for High Volume, High Precision Operations," www.aquabondtechnologies.com/Thermoplastic-Adhesives, Oct. 22, 2018, 2 pages.

* cited by examiner

METHOD FOR PRODUCING OPTOELECTRONIC SEMICONDUCTOR DEVICES AND OPTOELECTRONIC SEMICONDUCTOR DEVICE

This patent application is a national phase filing under section 371 of PCT/EP2018/078866, filed Oct. 22, 2018.

TECHNICAL FIELD

A method for producing optoelectronic semiconductor devices is provided. An optoelectronic semiconductor device is also provided.

SUMMARY

Embodiments provide a method for producing optoelectronic semiconductor devices wherein negative effects of mold flash can be avoided.

In particular, in the method according to embodiments a reflective encapsulation body is produced by film assisted molding. In order to avoid mold flash of the encapsulation body on a radiation exit side, an LED chip or a phosphor body is provided with a sacrificial layer. Possible mold flash on the device can be simultaneously removed by removing the sacrificial layer, or is avoided by means of the sacrificial layer.

According to at least one embodiment, the method is for producing optoelectronic semiconductor devices. In particular, the optoelectronic semiconductor devices are light-emitting diodes, LEDs for short. That is, the optoelectronic semiconductor devices can be to produce light, in particular visible light like white light.

According to at least one embodiment, the method comprises the step of providing a light-emitting diode chip and/or a phosphor body. The light-emitting diode chip, LED chip for short, preferably comprises a semiconductor layer sequence to produce radiation. A wavelength of the radiation to be produced is in particular in the near ultraviolet spectral range, in the visible range and/or in the near infrared spectral range. For example, the light-emitting diode chip is configured to produce blue light.

According to at least one embodiment, the semiconductor layer sequence is based on a III-V compound semiconductor material. The semiconductor material is for example a nitride compound semiconductor material such as $Al_nIn_{1-n-m}Ga_mN$ or a phosphide compound semiconductor material such as $Al_nIn_{1-n-m}Ga_mP$ or also an arsenide compound semiconductor material such as $Al_nIn_{1-n-m}Ga_m As$, wherein in each case $0 \leq n \leq 1$, $0 \leq m \leq 1$ and $n+m \leq 1$ applies. The semiconductor layer sequence may comprise dopants and additional constituents. For simplicity's sake, however, only the essential constituents of the crystal lattice of the semiconductor layer sequence are indicated, i.e. Al, As, Ga, In, N or P, even if these may in part be replaced and/or supplemented by small quantities of further substances. The semiconductor layer sequence is particularly preferably based on the AlInGaN material system.

According to at least one embodiment, the phosphor body is for partial or complete wavelength conversion of the light emitted by the light-emitting diode chip. That is, at least part of the radiation emitted by the light-emitting diode chip is absorbed by at least one luminescent material and is converted to a radiation with, in particular, a longer wavelength. For example, the phosphor body contains a luminescent material to produce yellow light from blue light so that the optoelectronic semiconductor device can emit white light.

The phosphor body can comprise a mixture of various luminescent materials, for example to produce yellow light and also to produce red light, for example, to enhance a color rendering index, especially in the red spectral range.

The phosphor body can comprise a luminescent material or a luminescent material mixture including at least one of the following materials: $Eu^{2+}$-doped nitrides such as $(Ca,Sr)AlSiN_3:Eu^{2+}$, $Sr(Ca,Sr)Si_2Al_2N_6:Eu^{2+}$, $(Sr,Ca)AlSiN_3*Si_2N_2O:Eu^{2+}$, $(Ca,Ba,Sr)_2Si_5N_8:Eu^{2+}$, $(Sr,Ca)[LiAl_3N_4]:Eu^{2+}$; garnets from the general system $(Gd,Lu,Tb,Y)_3(Al,Ga,D)_5(O,X)_{12}$:RE with X=halide, N or divalent element, D=tri- or tetravalent element and RE=rare earth metals such as $Lu_3(Al_{1-x}Ga_x)_5O_{12}:Ce^{3+}$, $Y_3(Al_{1-x}Ga_x)_5O_{12}:Ce^{3+}$; $Eu^{2+}$-doped sulfides such as $(Ca,Sr,Ba)S:Eu^{2+}$; $Eu^{2+}$-doped SiONs such as $(Ba,Sr,Ca)Si_2O_2N_2:Eu^{2+}$; SiAlONs for instance from the system $Li_xM_yLn_zSi_{12}$-(m+n)Al(m+n)$O_nN_{16-n}$; beta-SiAlONs from the system $Si_{6-x}Al_zO_yN_{8-y}$:$RE_z$; nitrido-orthosilicates such as $AE_{2-x-a}RE_xEu_aSiO_{4-x}N_x$, $AE_{2-x-a}RE_xEu_aSi_{1-y}O_{4-x-2y}N_x$ with RE=rare earth metal and AE=alkaline earth metal; orthosilicates such as $(Ba,Sr,Ca,Mg)_2SiO_4:Eu^{2+}$; chlorosilicates such as $Ca_8Mg(SiO_4)_4Cl_2:Eu^{2+}$; chlorophosphates such as $(Sr,Ba,Ca,Mg)_{10}(PO_4)_6Cl_2:Eu^{2+}$; BAM luminescent materials from the BaO—MgO—$Al_2O_3$ system such as $BaMgAl_{10}O_{17}:Eu^{2+}$; halophosphates such as $M_5(PO_4)_3(Cl,F):(Eu^{2+},Sb^{3O},Mn^{2+})$; SCAP luminescent materials such as $(Sr,Ba,Ca)_5(PO_4)_3Cl:Eu^{2+}$; KSF luminescent materials such as $K_2SiF_6:Mn4^+$. Quantum dots may moreover also be introduced as luminescent material. Quantum dots in the form of nanocrystalline materials which contain a group II-VI compound and/or a group III-V compound and/or a group IV-VI compound and/or metal nanocrystals, are preferred in this case.

According to at least one embodiment, the method comprises the step of applying a sacrificial layer to a top side of the phosphor body only or to a top side of the light-emitting diode chip only. That is, the respective top side and only the respective top side is covered by the sacrificial layer. Other components or other regions of the optoelectronic semiconductor device to be produced are thus preferably free of the sacrificial layer.

According to at least one embodiment, the method comprises the step of placing the phosphor body onto the light-emitting diode chip. This is done, for example, by means of a pick-and-place method. Thus, the phosphor body can be applied to the light-emitting semiconductor chip by means of an adhesive. Hence, between the phosphor body and the light-emitting diode chip there can be an adhesive, preferably a thin adhesive with a thickness of, for example, at most 10 μm or 5 μm or 2 μm.

As an alternative, the phosphor body can be placed to the light-emitting diode chip by means of lamination or also by means of printing like screen-printing. However, preferably the phosphor body has a defined geometry prior to application onto the light-emitting diode chip.

According to at least one embodiment, the method comprises the step of molding an encapsulation body, preferably directly around the light-emitting diode chip and/or the phosphor body. The molding is particularly preferably a film assisted molding.

According to at least one embodiment, a top face of the sacrificial layer facing away from the phosphor body and/or facing away from the light-emitting diode chip remains unsealed with a molding film used in the molding step. This applies in particular to at least one or to some of the light-emitting diode chips and/or the phosphor bodies provided with the encapsulation body. That is, as intended most of the phosphor bodies and/or of the light-emitting diode chips are sealed or completely sealed with the molding film. But, accidentally, the sealing is not perfect for all phosphor bodies and/or light-emitting diode chips.

According to at least one embodiment, the method comprises the step of removing the sacrificial layer. Thus, the top side of the phosphor body and/or of the light-emitting diode chip becomes free of the sacrificial layer.

In at least one embodiment, the method is for producing optoelectronic semiconductor devices and comprises the following steps, preferably in the stated order: providing a light-emitting diode chip and, as an option, a phosphor body, applying a sacrificial layer to a top side of the phosphor body only or to a top side of the light-emitting diode chip only, as an option, placing the phosphor body onto the light-emitting diode chip, molding an encapsulation body directly around the light-emitting diode chip and, as an option, directly around the phosphor body by means of film assisted molding, wherein in places a top face of the sacrificial layer facing away from the light-emitting diode chip remains unsealed with a molding film, and removing the sacrificial layer so that the top side of the phosphor body or of the light-emitting diode chip becomes free of the sacrificial layer.

Normally, when applying stacks of phosphor bodies and light-emitting diode chips onto a carrier, the stacks are not all of exactly the same height. Thus, there is a height variance of about +/−15 µm at an overall height of the light-emitting diode chips together with the phosphor bodies of around 250 µm. In a film assisted molding process, FAM for short, this height variance cannot be completely compensated for with a molding film. Thus, some of the light-emitting diode chips or phosphor bodies are not completely sealed with the molding film. Hence, during the film assisted molding a layer of mold flash can be created on a top side of the respective light-emitting diode chip and/or of the phosphor body.

If such a mold flash occurs on the phosphor body or on the light-emitting diode chip, the respective stack cannot be used or such a mold flash has to be removed, for example by means of wet blasting. In wet blasting, typically water with an abrasive material is used to remove the mold flash. However, in such a wet blasting process there is the risk of damage to the phosphor body or the encapsulation layer around the phosphor body.

With the method described herein, it is possible to achieve high yields by the method while additional steps like a conventional wet blasting process to remove the mold flash might be omitted. The sacrificial layer can be reliably removed under defined conditions while mold flash might be removed together with the sacrificial layer.

According to at least one embodiment, because of the unsealed top face, during molding the encapsulation body partly or completely extends onto the top face of the sacrificial layer and, thus, onto the top side of the phosphor body or of the light-emitting diode chip. That is, mold flash is created on the top side because the top side is not completely covered by the molding film in a tight manner.

According to at least one embodiment, the top side of the phosphor body is completely freed of the encapsulation body by removing the sacrificial layer. Thus, after removing the sacrificial layer, there is no, or no significant proportion of the top side covered with the encapsulation body or a material thereof. 'Significant proportion' means, for example, a proportion of at most 2% or 1% or 0.5%. That is, there might remain material of the encapsulation body to a very minor extent on the top side, said very minor extent does not, or not significantly, impair the emission characteristics of the finished optoelectronic semiconductor device.

According to at least one embodiment, a thickness of the encapsulation body on the sacrificial layer, prior to removing the sacrificial layer, is comparably small. This thickness of the encapsulation body is, for example, at least 0.3 µm or 0.5 µm or 2 µm and/or at most 20 µm or 15 µm or 10 µm.

According to at least one embodiment, an area proportion of the top face of the sacrificial layer covered with the encapsulation body prior to removing the sacrificial layer is at least 0.5% or 1% or 3% or 5%. As an alternative or additionally, this area proportion is at most 40% or 25% or 15%. Thus, the mold flash can cover the top face of the sacrificial layer to a comparably large extent.

According to at least one embodiment, the sacrificial layer has anti-wetting properties with respect to a material of the encapsulation body during the film assisted molding process. By means of such a material, it can be avoided that the encapsulation body covers the sacrificial layer and/or an extent of the top face of the sacrificial layer covered by the mold flash can be significantly reduced.

According to at least one embodiment, the sacrificial layer comprises a fluor-containing polymer, in particular a fluorinated or perfluorinated polymer. Such polymers can be similar to polytetrafluorethylene, also referred to as Teflon. Such polymers can preferably be applied to the phosphor body and/or to the light-emitting diode chip with a very small layer thickness of, for example, at most 1 µm.

According to at least one embodiment, the sacrificial layer is made of a thermoplastic polymer. Thus, the sacrificial layer can be applied efficiently to the light-emitting diode chip and/or to the phosphor body. In particular, fluorinated thermoplastic polymers are used.

According to at least one embodiment, the sacrificial layer is thermally removed. In particular, by heating the sacrificial layer, the adhesive properties of the sacrificial layer towards the phosphor body or toward the light-emitting diode chip are decreased. Hence, at elevated temperatures the sacrificial layer no longer adheres to the phosphor body and/or to the light-emitting diode chip. Preferably, the sacrificial layer is not destroyed thermally but remains as a contiguous and/or intact layer.

According to at least one embodiment, the thermal removal of the sacrificial layer takes place at a temperature of at least 100° C. or 150° C. or 180° C. As an alternative or in addition, the removal of the sacrificial layer takes place at a temperature of at most 280° C. or 250° C. or 230° C. At these temperatures, the light-emitting diode chip as well as the phosphor body remains unimpaired. Thus, the removal of the sacrificial layer does not damage the light-emitting diode chip and/or the phosphor body.

According to at least one embodiment, the sacrificial layer comprises a water-soluble polymer or consists thereof. Water-soluble polymers are described, for example, in patent applications US 2002/0035222 A1, EP 0 400 808 A2 or US 2009/0004373 A1. These documents are incorporated herein by reference in their entirety.

According to at least one embodiment, the sacrificial layer is removed by wet blasting. The wet blasting is preferably performed with one or more liquids only. That is, despite the liquid or the liquids in the wet blasting, no additional abrasive materials like particles are used.

According to at least one embodiment, the removal of the sacrificial layer by wet blasting is done with water, in particular with deionized water. It is possible that this wet blasting is done at a water temperature of at least 50° C. or 60° C. or 75° C. and/or at a water temperature of at most 95°

C. or 90° C. or 85° C. Thus, hot water can be used to remove the sacrificial layer. When using wet blasting, the sacrificial layer is preferably destroyed and does not remain as an intact, contiguous layer.

Pure water can be used. As an alternative, water containing an additive, in particular a liquid additive, might be used for the wet blasting. Such additives may increase the solubility of the polymer. Preferably, such additives have a concentration of at most 5% or 2% by volume.

According to at least one embodiment, the sacrificial layer is applied to the phosphor body prior to placing the phosphor body onto the light-emitting diode chip. For example, the sacrificial layer is applied to a phosphor layer which is formed as a sheet. Afterwards, the sheet comprising the luminescent material and the sacrificial layer can be singulated to the phosphor bodies. Afterwards, these phosphor bodies are applied to the respective light-emitting diode chips. Thus, it can be avoided that the light-emitting diode chips themselves come into contact with a material for the sacrificial layer. Hence, contamination of the light-emitting diode chips with a material for the sacrificial layers can be avoided.

As an alternative, the sacrificial layer is applied to the phosphor bodies when the phosphor bodies have already been placed to the respective light-emitting diode chips. However, preferably the sacrificial layer is applied to the phosphor body prior to placing the phosphor bodies onto the light-emitting diode chips.

According to at least one embodiment, the sacrificial layer is comparably thin. In particular, a thickness of the sacrificial layer on the phosphor body or on the light-emitting diode chip is at most 50 µm or 10 µm or 5 µm or 2 µm. As an alternative or in addition, the thickness of the sacrificial layer is at least 0.1 µm or 0.2 µm or 0.5 µm.

According to at least one embodiment, the phosphor body is a ceramic body or a polymer-containing body, especially a silicone-containing body. When the phosphor body is a ceramic body, this can mean that the phosphor body consists of phosphor particles that are sintered to the ceramic body. As an alternative, phosphor particles are embedded in a ceramic matrix material. When using polymers like silicones for the phosphor body, the luminescent material is preferably present in the form of particles that are embedded in a polymeric matrix material.

According to at least one embodiment, the light-emitting diode chip is attached to a first lead frame part and is electrically connected to a second lead frame part by means of a bond wire. As an alternative to a lead frame comprising the lead frame parts, a carrier comprising electrical contact areas and/or conductor tracks and/or electrical through connections can be used. Thus, a circuit board like a printed circuit board or like a metal core board or a ceramic board can be used as the carrier. It is also possible to omit bond wires so that the light-emitting diode chip can be a flip-chip, electrical contact areas of said flip-chip preferably face the carrier or the lead frame parts. Otherwise, electrical contact areas of said flip-chip can be on a side remote from the carrier or the lead frame parts.

According to at least one embodiment in which the light-emitting diode chip is electrically connected with at least one bond wire, the at least one bond wire is completely encapsulation in the encapsulation body. Thus, the bond wire can be protected against mechanical damage by means of the encapsulation body.

According to at least one embodiment, a plurality of light-emitting diode chips and a plurality of the respective phosphor bodies are simultaneously provided with the encapsulation body. Thus, a kind of artificial wafer comprising the encapsulation body, the light-emitting diode chips and the phosphor bodies can be created. Hence, immediately after molding of the encapsulation body, all of these light-emitting diode chips and all of these phosphor bodies are mechanically coupled to one another by means of the encapsulation body.

According to at least one embodiment, the thickness of light-emitting diode chips together with the respective associated phosphor bodies show a deviation around a mean value of at least 2 µm or 3 µm or 6 µm and/or of at most 3 µm or 20 µm or 15 µm. That is, there is a comparably large variance in the thicknesses of the light-emitting diode chips together with the associated phosphor bodies.

According to at least one embodiment, the sacrificial layer is removed from the corresponding phosphor body and/or light-emitting diode chip prior to a singulation step of the encapsulation body. By means of the singulation step, the optoelectronic semiconductor devices are formed. Thus, the sacrificial layer can be removed when the light-emitting diode chips and corresponding phosphor bodies are still mechanically coupled to one another. Thus, side faces of the encapsulation layer can be unimpaired by the removal of the sacrificial layer.

Moreover, an optoelectronic semiconductor device is provided. The optoelectronic semiconductor device is produced with a method according to at least one of the above-mentioned embodiments. Accordingly, features for the method are also disclosed for the optoelectronic semiconductor device and vice versa.

According to at least one embodiment, the optoelectronic semiconductor device comprises one or more than one of the light-emitting diode chips. At least one phosphor body of the optoelectronic semiconductor device is freely accessible on the respective phosphor body top side. The encapsulation body directly adjoins the light-emitting diode chip and the phosphor body all around when seen in top view onto the top side. The encapsulation body projects beyond the top side of the phosphor body. That is, a height or a thickness of the encapsulation body can exceed a height or a thickness of the phosphor body together with the associated light-emitting diode chip.

The encapsulation body can comprise at least one tear-off edge near the top side of the phosphor body. At the tear-off edge, the encapsulation body can extend onto the top side of the phosphor body to a minor proportion. As an alternative, at the tear-off edge the encapsulation body can have a reduced thickness compared with other regions of the encapsulation body.

BRIEF DESCRIPTION OF THE DRAWINGS

A method and an optoelectronic semiconductor device described here are explained in greater detail below by way of exemplary embodiments with reference to the drawing. Elements which are the same in the individual figures are indicated with the same reference signs. The relationships between the elements are not shown to scale, however, but rather individual elements may be shown exaggeratedly large to assist in understanding.

In the figures.

DETAILED DESCRIPTION OF ILLUSTRATIVE EMBODIMENTS

Figure 1:
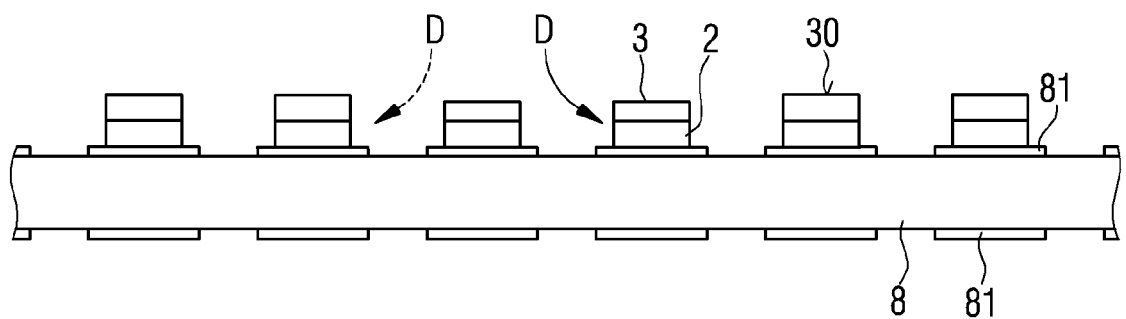
FIGS. 1 to 3 show schematic sectional views of method steps of a modified method.
Figure 2:
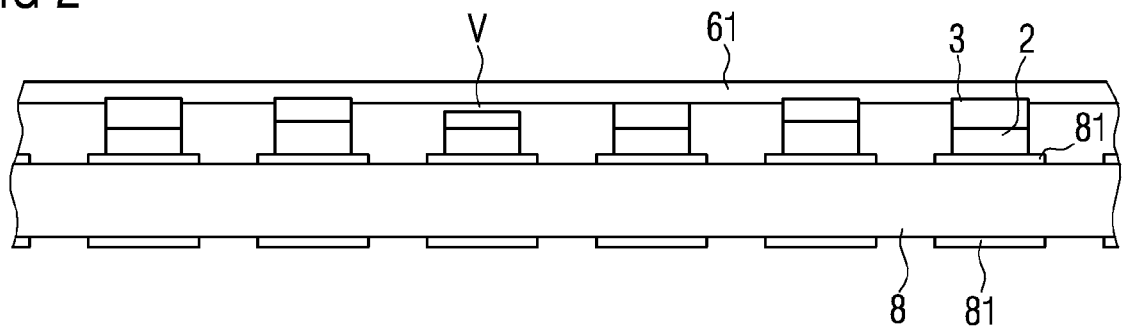
Figure 3:
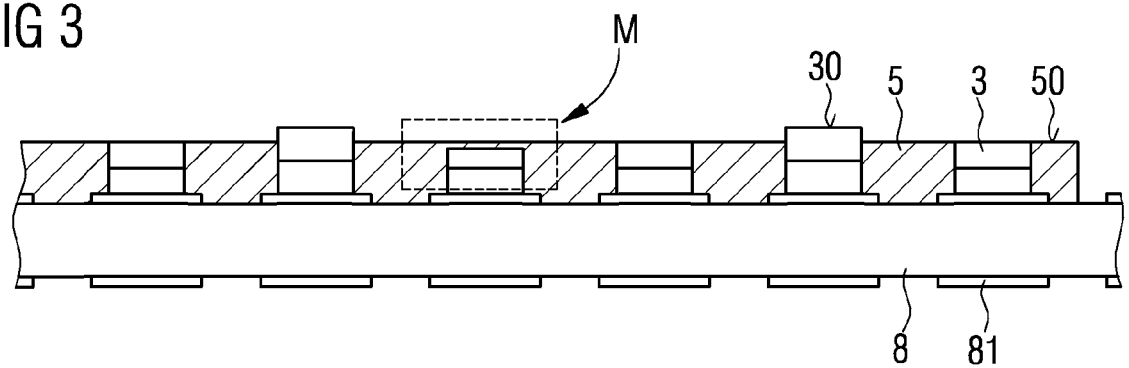

FIGS. 1 to 3 show method steps of a modification of a method. According to FIG. 1, light-emitting diode chips 2 are applied to a carrier 8. The carrier 8 is equipped with electrical contact areas 81. On top of the light-emitting diode chips 2 there are phosphor bodies 3. Because of manufacturing tolerances, there are height differences D between the individual stacks of the light-emitting diode chips 2 and the associated phosphor bodies 3.

When these stacks of light-emitting diode chips 2 and phosphor bodies 3 are processed in a film assisted molding, compare FIG. 2, some of the stacks press into a molding film 61 and others terminate flush with the molding film 61. However, at some of the stacks, there could be a void V at the respective phosphor body so that the molding film 61 does not tightly seal the respective phosphor body 3 at a top side 30.

Hence, when forming an encapsulation body 5 with the film assisted molding method, it is possible that a mold flash M covers some of the stacks of the light-emitting diode chips 2 and the phosphor bodies 3. Other stacks may terminate flush with a top 50 of the encapsulation body 5 or may also extend with their top sides 30 beyond the top 50 of the encapsulation body 5. This is illustrated in FIG. 3.

Figure 4:
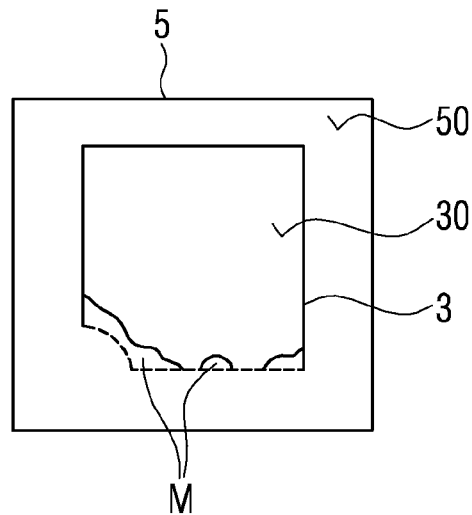
FIG. 4 shows a top view of a modified semiconductor device produced with a modified method.

In the top view in FIG. 4 it is illustrated that in the finished device such a mold flash M can partially cover the top side 30 of the respective phosphor body 3. Thus, a light emission of the respective device is decreased. As shown in FIG. 4, the mold flash M may not necessarily cover the complete top side 30 but may cover a significant part of the top side 30 to hamper light emission.

To prevent such mold flash on a top side of a phosphor body 3 or also on a top side of a light-emitting diode chip 2, in FIGS. 5 to 9 a first exemplary embodiment of the method described herein is illustrated.

Figure 5:
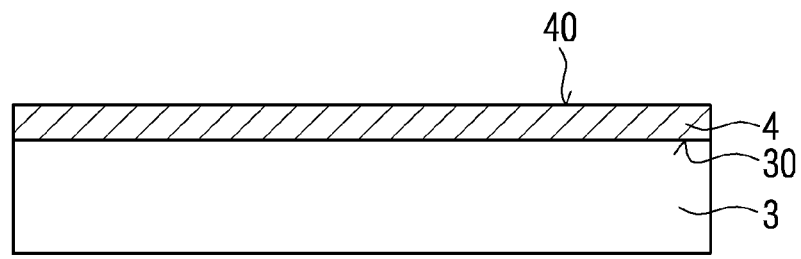
FIGS. 5 to 7 show sectional views of method steps of a method described here to produce optoelectronic semiconductor devices described herein.

According to FIG. 5, the optional phosphor bodies 3 are provided. Top sides 30 of the phosphor bodies 3 are completely covered with a sacrificial layer 4. A top face 40 of the sacrificial layer 4 faces away from the illustrated phosphor body 3.

Contrary to what is shown in FIG. 5, preferably the sacrificial layer 4 is applied simultaneously to a plurality of the phosphor bodies 3 which can be present in a phosphor sheet. Afterwards, a singulation of the sacrificial layer 4 and of the sheet to individual phosphor bodies for the light-emitting diode chips 2 is performed, not shown.

Figure 6:
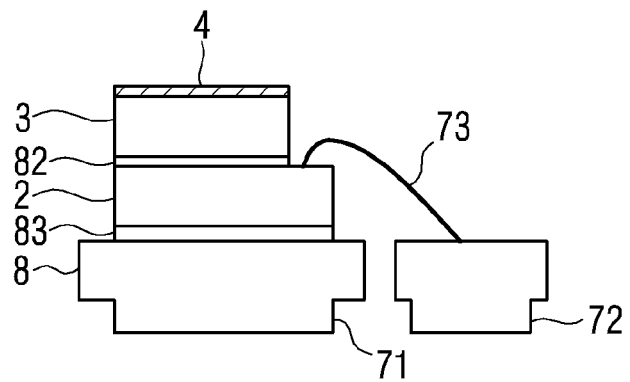

In the method step of FIG. 6, the phosphor bodies 3 with the sacrificial layers 4 are applied to light-emitting diode chips 2. Between the light-emitting diode chips 2 and the respective phosphor bodies 3, there can be an adhesive 82. For example, the adhesive 82 is a silicone glue.

As an example, the light-emitting diode chips 2 might be mounted to a carrier 8 that can be formed of first lead frame parts 71 and of second lead frame parts 72. The light-emitting diode chips 2 are applied to the first lead frame parts 71. An electrical connection for the second lead frame parts 72 is realized by bond wires 73. The light-emitting diode chips 2 might be adhered to the first lead frame parts 71 and, hence, to the carrier 8, by means of a solder 83.

Figure 7:
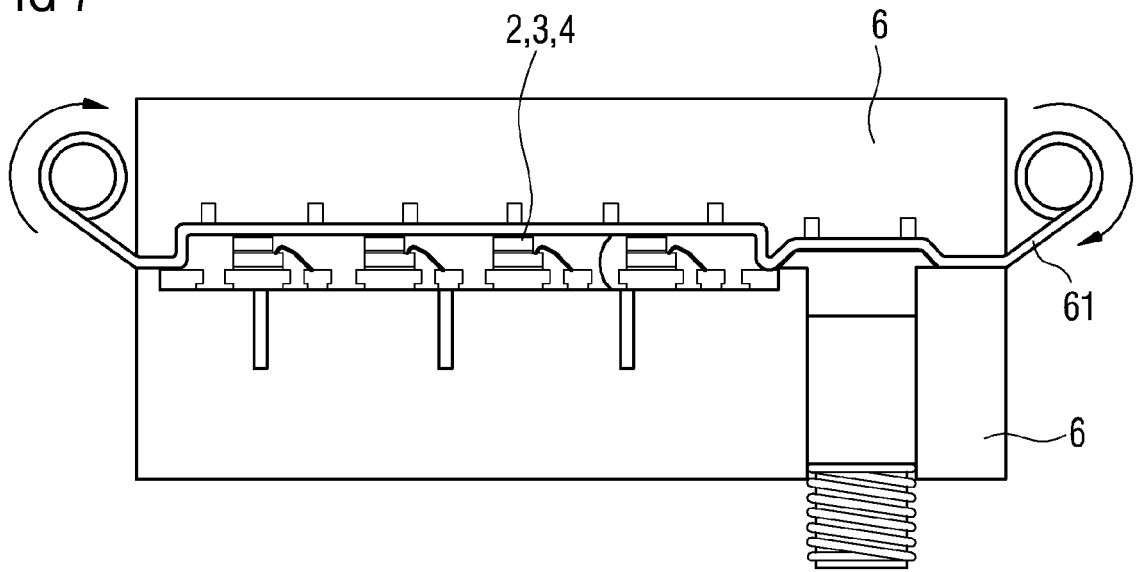

In the method step of FIG. 7, the film assisted molding step is schematically illustrated. A multiplicity of the units shown in FIG. 6 is placed into a mold 6. To seal the top sides 30 of the phosphor bodies 3, the molding film 61 is cycled through the mold 6. By means of the molding film 61, the mold 6 is sealed. A material for the encapsulation body is pressed into the mold 6.

Figure 8:
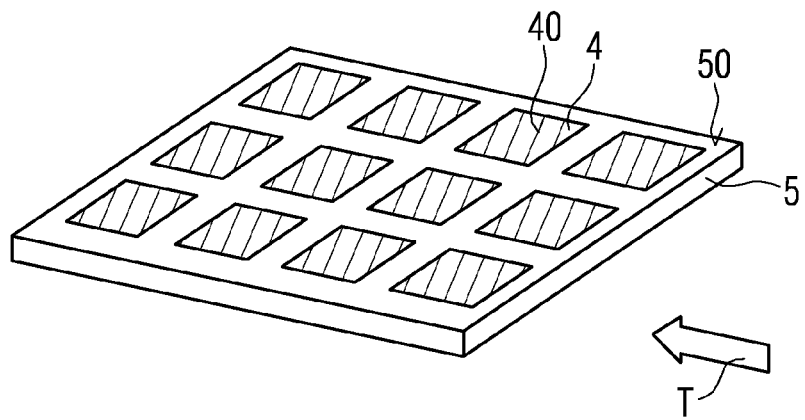
FIGS. 8 and 9 show perspective views of method steps of a method described here to produce optoelectronic semiconductor devices described herein.

In FIG. 8, the resulting artificial wafer after the molding step is shown. The encapsulation body 5 mechanically integrates a plurality of the light-emitting diode chips 2 with the sacrificial layer 4 on top sides 30 of the respective phosphor bodies 3. The top face 40 of the individual sacrificial layers 4 terminate approximately flush with the top 50 of the encapsulation body 5. The sacrificial layers 4 are completely surrounded by the material of the encapsulation body 5.

In this embodiment, the sacrificial layer 4 is preferably a fluorinated polymer that can be removed by increased temperature T. For example, the fluoropolymer Novec™ 1700 Electronic Grade Coating from 3M™ is used. For example, the sacrificial layer is removed by heating up to 250° C. Any mold flash on the sacrificial layer 4 will be removed together with the sacrificial layer 4.

Figure 9:
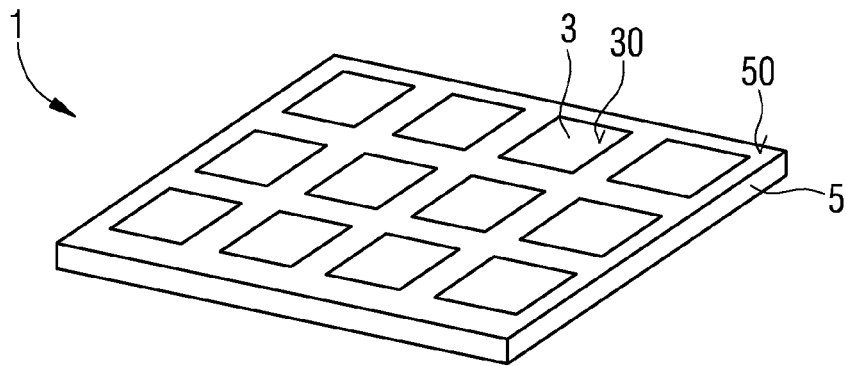

The resulting arrangement is shown in FIG. 9. Thus, the top sides 30 of the phosphor bodies 3 are exposed. Because of the small thickness of the sacrificial layer 4, the top sides 30 terminate approximately flush with the top 50 of the encapsulation body 5.

Thus, a yield loss due to mold flash in the film assisted molding process can be reduced. This also reduces the need of comparably small thickness tolerances for the components used in the present production method. This could significantly reduce the material costs. Moreover, no physical damage or scarring occurs on the LED devices because methods to remove mold flash like wet blasting using abrasive materials are not needed.

Figure 10:
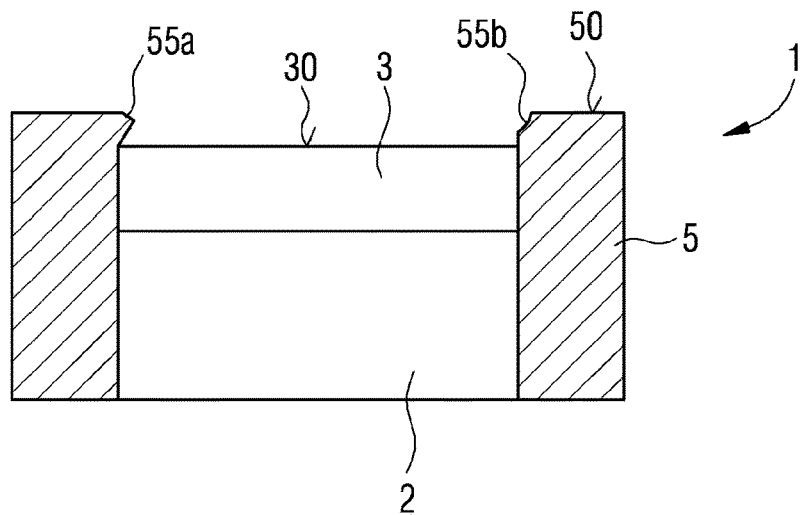
FIG. 10 shows a sectional view of an exemplary embodiment of an optoelectronic semiconductor device described herein.

An exemplary embodiment of the finished optoelectronic semiconductor device 1 is illustrated in FIG. 10. FIG. 10 shows the device 1 after an optional singulation process of the sheet as shown in FIG. 9.

As is illustrated in FIG. 10, the encapsulation body 5 can extend beyond the top side 30 of the phosphor body 3. At edges of the encapsulation body 5 near the top side 30, there can be tear-off edges 55*a*, 55*b*. At the tear-off edge 55*a*, the encapsulation body 5 covers the top side 30 to a minor extent. Contrary to that, at the tear-off edge 55*b*, the encapsulation body 5 is removed to a minor extent so that the encapsulation body 5 has a reduced thickness near the phosphor body 3.

Both kinds of tear-off edges 55*a*, 55*b* might be present in a single device or only one type of tear-off edge 55*a*, 55*b* is present. Corresponding tear-off edges 55*a*, 55*b* could also be present in all other exemplary embodiments.

The encapsulation body 5 is, for example, of a silicone in which reflective particles are embedded. Such reflective particles are, for example, made of a metal oxide like titanium dioxide or zirconium dioxide. Such particles could have diameters in the nanometer range or also in the micrometer range. Because of the large difference in the refractive index between such particles and the silicon matrix material, the encapsulation body appears white to an observer and has a high reflectivity. Such an encapsulation body 5 can also be used in all other exemplary embodiments.

Figure 11:
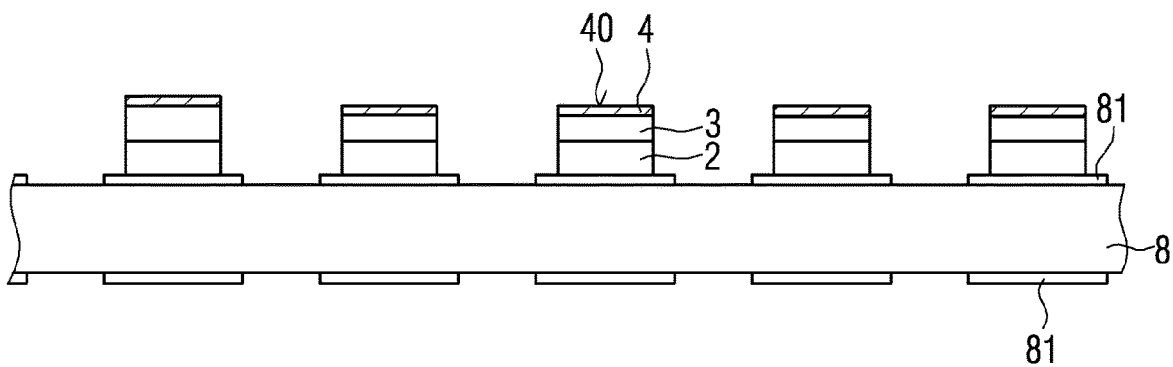
FIGS. 11 and 12 show sectional views of method steps of a method described herein to produce optoelectronic semiconductor devices described herein.
Figure 12:
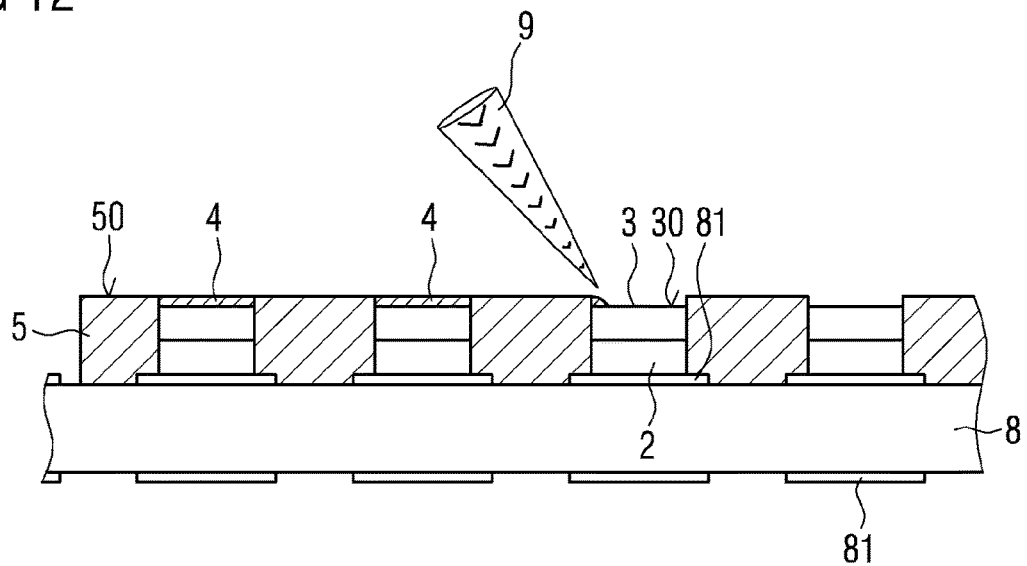

In FIGS. 11 and 12, a second exemplary embodiment of the method is illustrated. According to FIG. 11, the plurality of the light-emitting diode chips with the phosphor bodies 3 and with the sacrificial layers 4 are applied. The respective stacks are attached to a carrier 8. These stacks comprising the light-emitting diode chips 2 exhibit a thickness deviation of, for example, around 10 μm.

The subsequent step of forming the encapsulation body 5 is carried out analogously to FIG. 7.

However, the sacrificial layer 4 in this exemplary embodiment of the method is formed of a water-soluble polymer. Thus, compare FIG. 12, the sacrificial layer 4 is removed by wet blasting with a water jet 9. The wet blasting is preferably performed with deionized water only, for example at a water temperature of around 80° C. As no additional abrasive materials like particles are needed, the risk of damaging the phosphor bodies 3 and the encapsulation body 5 is minimized.

For example, in this exemplary embodiment the sacrificial layer 4 is of Aquabond 85 from Aquabond Technologies.

Thus, during the wet blasting process, the high performance water-soluble thermoplastic adhesive layer 4 could be easily washed away by normal water. Therefore, the water blasting process does not require any strong abrasive chemicals or solids like particles; instead, non-abrasive chemical material and normal water are sufficient to carry out the wet blasting. With the sacrificial layer 4, mold flash or unwanted material residues are also washed away with the sacrificial layer 4 during the wet blasting process when the sacrificial layer 4 is dissolved within the water applied by water jet 9.

Hence, using a sacrificial layer 4 of a water-soluble polymer, mild parameters can be used in a water wet blasting process without the need for abrasive materials. This can eliminate the risk of damaging a layer surface or thinning the layer of the phosphor bodies so that color shifts or brightness drops can be avoided. Further, damage to the encapsulation layer which could impact on optical illuminance performance could also be avoided. As no abrasive material is needed, the wet blast process could be more cost-efficient. Also a simplified handling of the waste water from the wet blast process is enabled.

Afterwards, a singulation can be performed as explained in connection with FIGS. 9 and 10.

Figure 13:
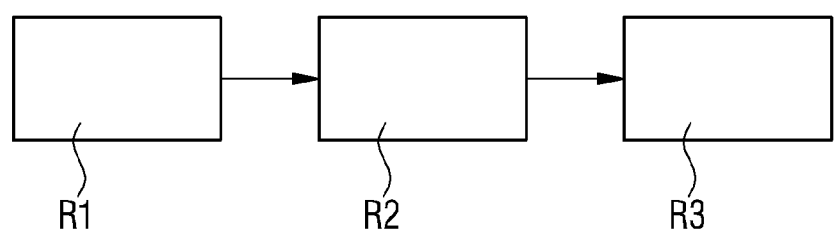
FIGS. 13 and 14 show block diagrams of a modification of a method and of an embodiment of a method described herein.

In FIG. 13, a modification of a method is illustrated as a block diagram. In method step R1, the film assisted molding process is carried out wherein mold flash can be formed directly on the top side of the phosphor bodies because there is no sacrificial layer.

In method step R2, a wet blasting process using an abrasive material, in particular abrasive particles, is performed.

Afterwards, compare method R3, singulation is carried out.

Figure 14:
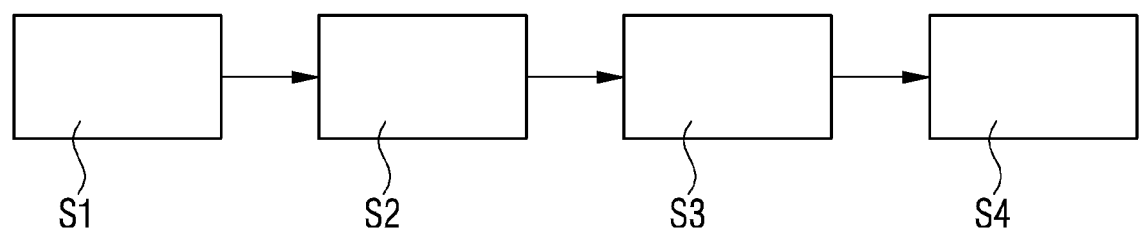

The method of FIGS. 11 and 12 is schematically shown in the block diagram of FIG. 14. In method step S1, the sacrificial layer 4 is applied on top of the phosphor bodies 3. The sacrificial layer 4 is preferably of a water-soluble adhesive layer or of a fluorinated polymer.

In method step S2, the film assisted molding process is carried out wherein eventual mold flash is trapped on top of the sacrificial layer.

According to method step S3, the mold flash is removed together with the sacrificial layer 4 wherein no abrasive material is needed. Removal is carried out preferably by means of a water jet or by means of elevated temperature.

In method step S4, optional singulation to the optoelectronic semiconductor devices 1 is carried out.

The components shown in the figures follow, unless indicated otherwise, preferably in the specified sequence directly one on top of the other. Layers which are not in contact in the figures are preferably spaced apart from one another. If lines are drawn parallel to one another, the corresponding surfaces are preferably oriented parallel to one another. Likewise, unless indicated otherwise, the positions of the drawn components relative to one another are correctly reproduced in the figures.

The invention described here is not restricted by the description on the basis of the exemplary embodiments. Rather, the invention encompasses any new feature and also any combination of features, which includes in particular any combination of features in the patent claims, even if this feature or this combination itself is not explicitly specified in the patent claims or exemplary embodiments.

The invention claimed is:

1. A method comprising:
providing light-emitting diode chips;
providing individual phosphor bodies having applied individual sacrificial layers at top sides of the individual phosphor bodies only;
placing the individual phosphor bodies having the individual sacrificial layers applied on the top sides onto the light-emitting diode chips so that each one of the light-emitting diode chips is provided with one of the individual phosphor bodies having one of the individual sacrificial layers applied on its top side and so that stacks comprising one of the light-emitting diode chips, one of the individual phosphor bodies and one of the individual sacrificial layers result;
molding an encapsulation body directly around the stacks by a film assisted molding so that the stacks are pressed into a molding film, wherein, in places, top faces of the individual sacrificial layers facing away from the individual phosphor bodies remain unsealed with the molding film, and wherein the individual sacrificial layers seal the top sides of the individual phosphor bodies from a material of the encapsulation body; and
removing the individual sacrificial layers so that the top sides of the individual phosphor bodies are free of the individual sacrificial layers,
wherein removing the individual sacrificial layers comprise removing the individual sacrificial layers by wet blasting with at least one liquid,
wherein the wet blasting is performed with deionized water at a temperature of between 60° C. and 95° C., inclusive,
wherein the individual sacrificial layers are applied to the individual phosphor bodies prior to placing the individual phosphor bodies onto the light-emitting diode chips,
wherein the individual sacrificial layers comprise a water-soluble polymer, and
wherein the individual phosphor bodies are ceramic bodies.

2. The method according to claim 1,
wherein, because of the unsealed top faces while molding, the encapsulation body partly extends onto the top faces of the individual sacrificial layers and onto the top sides of the individual phosphor bodies, and
wherein the top sides of the individual phosphor bodies are completely freed of the encapsulation body by removing the individual sacrificial layers.

3. The method according to claim 2,
wherein a thickness of the encapsulation body on the individual sacrificial layers, prior to removing the individual sacrificial layers, is between 0.5 µm and 15 µm inclusive,
wherein area proportions of the top faces of the individual sacrificial layers covered with the encapsulation body is between 1% and 25% inclusive.

4. The method according to claim 1, wherein the individual sacrificial layers have anti-wetting properties with respect to the material of the encapsulation body.

5. The method according to claim 4, wherein the individual sacrificial layers comprise a fluorinated polymer.

6. The method according to claim 1, wherein a thickness of the individual sacrificial layers is between 0.2 µm and 10 µm inclusive.

7. The method according to claim 1, wherein the light-emitting diode chips are attached to first lead frame parts and are electrically connected with second lead frame parts by bond wires, and wherein the bond wires are completely encapsulated in the encapsulation body.

8. The method according to claim 1, wherein, immediately after molding, all of the light-emitting diode chips are mechanically coupled to one another by the encapsulation body, and wherein thicknesses of the light-emitting diode chips together with associated phosphor bodies show a deviation of between 3 µm and 20 µm inclusive.

9. The method according to claim 8, wherein the individual sacrificial layers are removed prior to singulating the encapsulation body, and wherein semiconductor devices are formed by singulating.

10. A method comprising:
providing light-emitting diode chips;
providing individual phosphor bodies having applied individual sacrificial layers at top sides of the individual phosphor bodies only;
placing the individual phosphor bodies having the individual sacrificial layers applied on the top sides onto the light-emitting diode chips so that each one of the light-emitting diode chips is provided with one of the individual phosphor bodies having one of the individual sacrificial layers applied on its top side and so that stacks comprising one of the light-emitting diode chips, one of the individual phosphor bodies and one of the individual sacrificial layers result;
molding an encapsulation body directly around the stacks by a film assisted molding so that the stacks are pressed into a molding film, wherein, in places, top faces of the individual sacrificial layers facing away from the individual phosphor bodies remain unsealed with the molding film, and wherein the individual sacrificial layers seal the top sides of the individual phosphor bodies from a material of the encapsulation body; and
removing the individual sacrificial layers so that the top sides of the individual phosphor bodies are free of the individual sacrificial layers,
wherein the individual sacrificial layers are applied to the individual phosphor bodies prior to placing the individual phosphor bodies onto the light-emitting diode chips,
wherein the individual phosphor bodies are ceramic bodies,
wherein the individual sacrificial layers are made of water-soluble polymer, and
wherein the individual sacrificial layers are removed by wet blasting with a water jet.

* * * * *